United States Patent
Ishikawa et al.

(10) Patent No.: US 10,243,107 B2
(45) Date of Patent: Mar. 26, 2019

(54) LIGHT EMITTING DEVICE AND METHOD FOR MANUFACTURING THEREOF

(71) Applicant: NICHIA CORPORATION, Anan-shi, Tokushima (JP)

(72) Inventors: Tetsuya Ishikawa, Anan (JP); Gensui Tamura, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/717,183

(22) Filed: Sep. 27, 2017

(65) Prior Publication Data
US 2018/0090644 A1    Mar. 29, 2018

(30) Foreign Application Priority Data

Sep. 28, 2016 (JP) ................. 2016-190027
Sep. 26, 2017 (JP) ................. 2017-184459

(51) Int. Cl.
*H01L 33/38* (2010.01)
*H01L 33/54* (2010.01)
*H01L 33/62* (2010.01)

(52) U.S. Cl.
CPC ............ *H01L 33/382* (2013.01); *H01L 33/54* (2013.01); *H01L 33/62* (2013.01); *H01L 2224/48091* (2013.01); *H01L 2224/48247* (2013.01); *H01L 2224/48257* (2013.01)

(58) Field of Classification Search
CPC ....... H01L 33/486; H01L 33/62; H01L 33/54; H01L 33/56; H01L 33/382; H01L 2224/48091; H01L 2224/48257; H01L 2224/482471

USPC .......................................... 257/99, 100, 678
See application file for complete search history.

(56) References Cited

U.S. PATENT DOCUMENTS

| | | | |
|---|---|---|---|
| 7,595,549 B2 * | 9/2009 | Kamikawa | H01L 23/49551 257/13 |
| 2010/0163918 A1 | 7/2010 | Kim et al. | |
| 2012/0025227 A1 | 2/2012 | Chan et al. | |
| 2012/0235287 A1 | 9/2012 | Karim et al. | |

(Continued)

FOREIGN PATENT DOCUMENTS

| CN | 201689919 U | 12/2010 |
|---|---|---|
| CN | 202259287 U | 5/2012 |

(Continued)

*Primary Examiner* — Jasmine J Clark
(74) *Attorney, Agent, or Firm* — Global IP Counselors, LLP

(57) ABSTRACT

A light emitting device includes a resin molding, first and second leads, and a light emitting element. The resin molding includes a front surface defining an opening, and a lower surface adjacent to the front surface. The first and second leads each includes an outer lead portion and an inner lead portion. The outer lead portion protrudes from the lower surface of the resin molding, and includes a bent portion bent along the lower surface. A surface on an inner side of the bent portion including a first recessed section. The inner lead portion includes an embedded portion embedded in the resin molding, and an exposed portion exposed in the opening. A surface of the embedded portion opposite from the surface where the first recessed section is provided includes a second recessed with a part of the resin molding being positioned in the second recessed section.

11 Claims, 14 Drawing Sheets

(56) References Cited

U.S. PATENT DOCUMENTS

| | | | | |
|---|---|---|---|---|
| 2013/0056788 A1* | 3/2013 | Haraguchi | ............ | H01L 33/486 |
| | | | | 257/99 |
| 2013/0062613 A1 | 5/2013 | Takeshita et al. | | |
| 2014/0291828 A1* | 10/2014 | Yasunaga | .......... | H01L 23/49541 |
| | | | | 257/676 |

FOREIGN PATENT DOCUMENTS

| | | |
|---|---|---|
| CN | 202363509 U | 8/2012 |
| CN | 202585525 U | 12/2012 |
| CN | 204424317 U | 6/2015 |
| JP | H04-12663 U | 1/1992 |
| JP | 05-109928 A | 4/1993 |
| JP | 05-326782 A | 12/1993 |
| JP | H06-37224 A | 2/1994 |
| JP | 07-014960 A | 1/1995 |
| JP | 2000-294711 A | 10/2000 |
| JP | 2006-222382 A | 8/2006 |
| JP | 2008-258233 A | 10/2008 |
| JP | 2009-004443 A | 1/2009 |
| JP | 2012-515440 A | 7/2012 |
| JP | 2013-062338 A | 4/2013 |
| WO | 2010-081403 A1 | 7/2010 |
| WO | 2012-059063 A1 | 5/2012 |

* cited by examiner

LIGHT EMITTING DEVICE AND METHOD FOR MANUFACTURING THEREOF

CROSS-REFERENCE TO RELATED APPLICATION

This application claims priority to Japanese Patent Applications No. 2016-190027 filed on Sep. 28, 2016 and No. 2017-184459 filed on Sep. 26, 2017 the disclosure of which is hereby incorporated by reference in its entirety.

TECHNICAL FIELD

The present disclosure relates to a light emitting device and a method for manufacturing thereof.

BACKGROUND

Light emitting devices with high luminance, high output, and a small size have been developed and used in various fields. For example, light sources used for the backlight of a liquid crystal display device is expected to be made thinner in order to reduce the size and weight of the device in which these light sources are used. To that end, for example, various types of side-view light emitting devices have been developed. A side-view light emitting device generally has a structure that a light emitting element is mounted in a package in which an opening for light emission is formed in the front surface of the package, and two lead electrodes extend outward as external terminals from the lower surface of the package. The two lead electrodes extending outward are bent toward the front surface side of the package, or toward the rear surface side opposite the front side, and the lower surface side of these bent lead electrodes serves as the mounting surface (See Japanese Patent Publication No. 2008-258233 as a reference).

SUMMARY

The light emitting device described above, two lead electrodes that extend from the lower surface of the package are bent at a specific angle, but there is variance in machining accuracy such as a deviation of the bending position and fluctuation in the bending angle, and this can diminish the mounting accuracy of the light emitting device.

It is an object of an embodiment of the present disclosure to provide a light emitting device with good mounting accuracy, and a method for manufacturing such the light emitting device.

One embodiment of a light emitting device of the present disclosure includes a resin molding, a first lead and a second lead, and a light emitting element. The resin molding includes a front surface defining an opening, and a lower surface adjacent to the front surface. The first lead and the second lead each includes an outer lead portion and an inner lead portion. The outer lead portion protrudes from the lower surface of the resin molding, and includes a bent portion bent along the lower surface of the resin molding. A surface on an inner side of the bent portion including a first recessed section. The inner lead portion includes an embedded portion embedded in the resin molding, and an exposed portion exposed in the opening. A surface of the embedded portion opposite from the surface where the first recessed section is provided includes a second recessed with a part of the resin molding being positioned in the second recessed section. The light emitting element is placed in the opening of the resin molding.

One embodiment of a method of manufacturing a light emitting device of the present disclosure includes providing a package including a resin molding, and a first lead and a second lead. The resin molding includes a front surface defining an opening, and a lower surface adjacent to the front surface. The first lead and the second lead each includes an outer lead portion and an inner lead portion. The outer lead portion protrudes from the lower surface of the resin molding. A surface of the outer lead portion includes a first recessed section. The inner lead portion includes an embedded portion embedded in the resin molding, and an exposed portion exposed in the opening. A surface of the embedded portion opposite from the surface where the first recessed section is provided includes a second recessed with a part of the resin molding being positioned in the second recessed section. The method further includes bending each of the first lead and the second lead at the first recessed section of the outer lead portion such that the outer lead portion extends along the lower surface of the resin molding.

One embodiment of a light emitting device of the present disclosure includes a resin molding, a first lead and a second lead, and light emitting element. The resin molding includes an opening in a front surface thereof, embeds a portion of the first lead and second lead, and includes a lower surface adjacent to the front surface. The light emitting element is placed in the opening. The first lead and second lead each include an outer lead portion, an inner lead portion, and a thin portion or a plurality of holes. The outer lead portion protrudes from the lower surface of the resin molding, and includes a bent portion that is bent along the lower surface of the resin molding. The inner lead portion includes an embedded portion that is embedded in the resin molding, and an exposed portion that is exposed in the opening. The thin portion or a plurality of holes are provided on the bent portion of the outer lead portion and the embedded portion of the inner lead portion. The thin portion has a thickness smaller than an average thickness of the first lead and the second lead.

With the light emitting device and method for manufacturing thereof according to an embodiment of the present disclosure, a light emitting device with an good mounting precision can be obtained in a high accuracy.

DETAILED DESCRIPTION

Figure 1A:
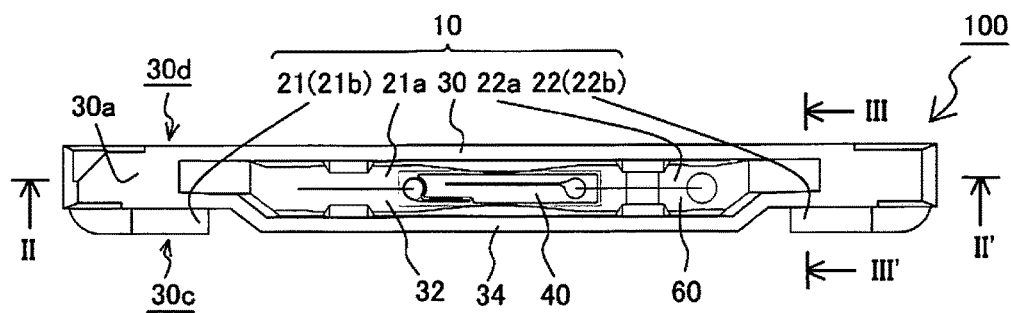
FIG. 1A is a schematic front view of the light emitting device in an embodiment of the present disclosure.
Figure 1B:
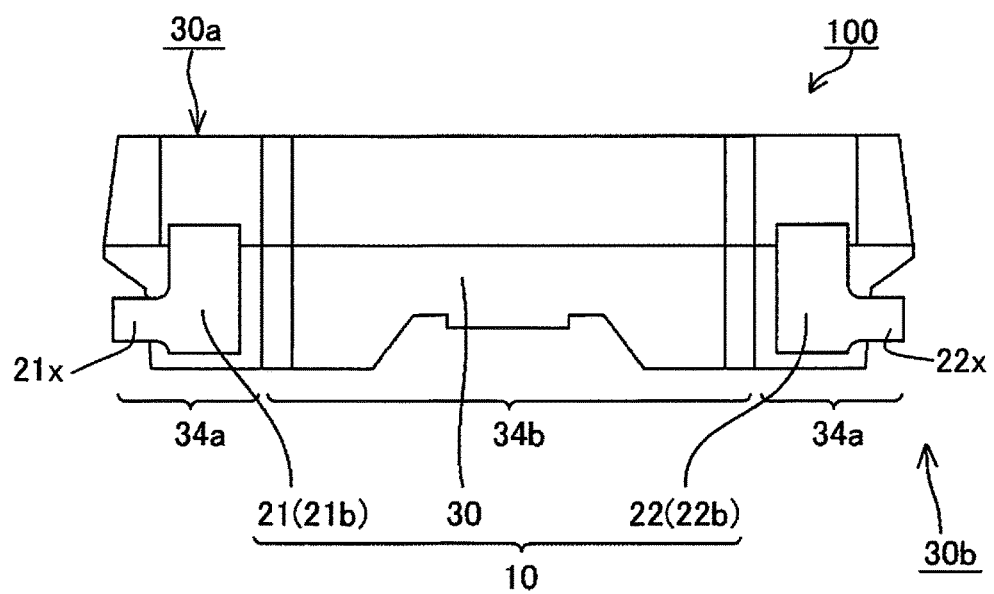
FIG. 1B is a schematic bottom view of the light emitting device in FIG. 1A.
Figure 1C:
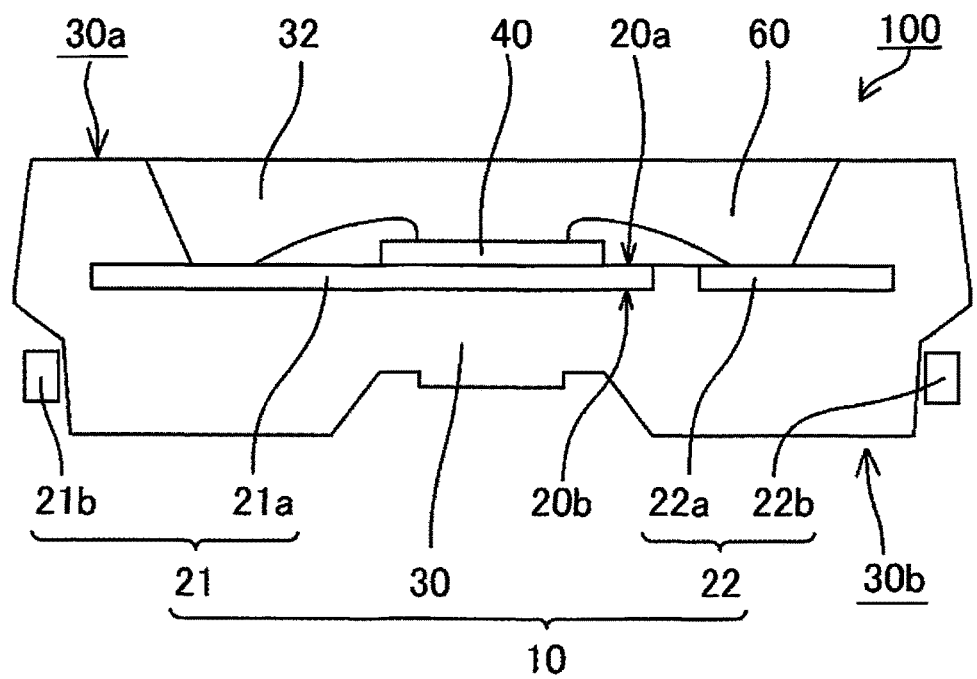
FIG. 1C is a schematic cross-sectional view along the line.
Figure 1D:
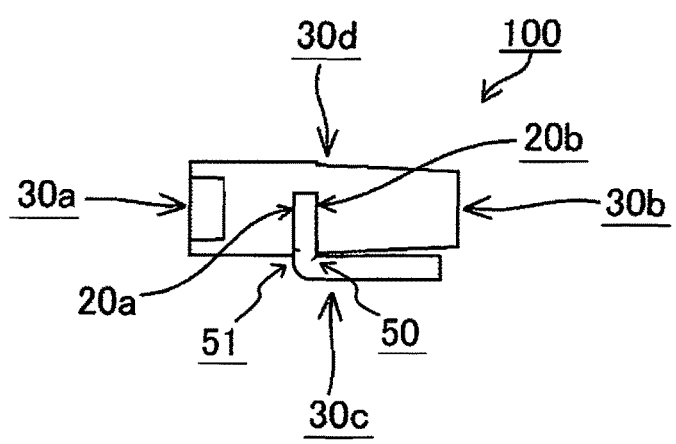
FIG. 1D is a schematic cross-sectional view along the line in FIG. 1A.

An embodiment of the present disclosure will be described below with reference to the accompanying drawings. In the following embodiments that embody the technological concept of the present disclosure are just examples, and are not intended to limit the scope of the present invention unless otherwise specified. Also, the sizes and the positional relationship of the members described in the drawings may be exaggerated for the sake of clarity.

Embodiment 1

Light-Emitting Device

As shown in FIGS. 1A to 1D, the light emitting device 100 in this embodiment includes a first lead 21 and a second lead 22; a resin molding 30 that includes an opening 32 in its front surface 30a, embeds a portion of the first lead 21 and the second lead 22, and includes a lower surface 30c adjacent to the front surface 30a; and a light emitting element 40 that is mounted in the opening 32.

In the present application, the container that is constituted by the first lead 21, the second lead 22, and the resin molding 30, houses the light emitting element 40, and has terminals (i.e., electrodes) for supplying power from the outside to the light emitting element 40 is sometimes referred to as a package. In this package 10, the surface of the resin molding 30 on the side including the light emitting surface is referred to as the front surface 30a, the surface on the opposite side of the front surface 30a as the rear surface 30b, the surface adjacent to the front surface as the lower surface 30c, and the surface on the opposite side of the lower surface 30c as the upper surface 30d. The package 10 shown in FIG. 1A and elsewhere is, for example, to be used with side-emission type of light emitting device, and the lower surface 30c usually serves as the mounting surface of the light emitting device 100.

First Lead 21 and Second Lead 22

The first lead 21 and the second lead 22 constitute a pair of positive and negative terminals (electrodes) in the package 10. The first lead 21 and the second lead 22 each have a first surface 20a and a second surface 20b opposite to the first surface 20a. The first surface 20a is exposed on the bottom surface of the opening 32 of the resin molding 30. On the first surface 20a, wires that are electrically connected to the light emitting element 40 are provided. The first surface 20a of the first lead 21 and the first surface 20a of the second lead 22 are disposed in such a manner as to be located on the same side. As will be discussed below, the first lead 21 and the second lead 22 each include a second recess 51 (one example of a second recessed section) in the first surface 20a, and a first recess (one example of a first recessed section) in the second surface 20b.

The first lead 21 and the second lead 22 respectively include inner lead portions 21a and 22a and outer lead portions 21b and 22b.

The outer lead portions 21b and 22b protrude from the lower surface 30c of the resin molding 30 to the outside, and are bent along the lower surface of the resin molding. The outer lead portions 21b and 22b may be bent in such a manner as to extend in the direction of the surface of the resin molding on the opposite side from the front surface 30a, that is, toward the rear surface 30b (see FIG. 1D), or may be bent in such a manner as to extend in the direction of front surface 30a (see FIG. 1F). Since the outer lead portions 21b and 22b protrude from the lower surface 30c of the resin molding 30, the heat dissipation path from the light emitting element 40 to the mounting board can be shortened.

The outer lead portions 21b and 22b include extensions that extend toward the left and right side surfaces of the resin molding 30. The extensions are bent in such a manner as to extend upward along the lateral surfaces of the resin molding 30, and are preferably disposed on the lateral surfaces. This affords better stability when the light emitting device 100 is mounted on a mounting board or the like. In particular, in this embodiment, the position and angle of the bent portions of the outer lead portions 21b and 22b are stabilized by the first recesses 50. Along with this, the position and angle of the portions of the extensions disposed on the lateral surfaces of the resin molding 30 can be stabilized, and the light emitting device 100 can be mounted more stably.

Figure 1E:
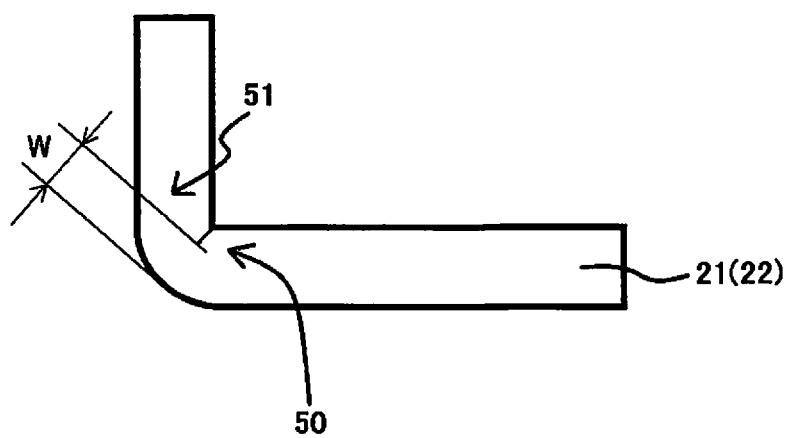
FIG. 1E is an enlarged view of the lead in FIG. 1D.
Figure 1F:
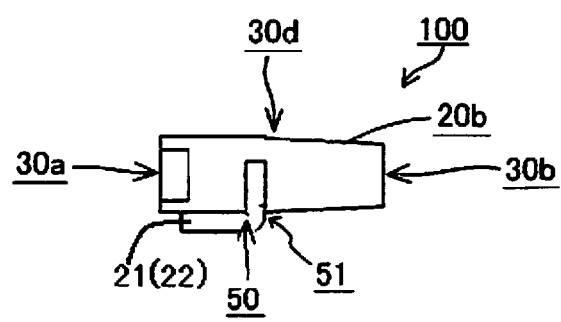
FIG. 1F is cross-sectional view of an alternate example of the light emitting device in FIG. 1A.
Figure 3A:
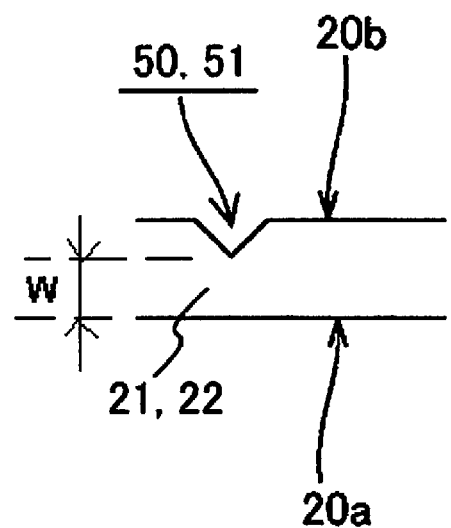
FIG. 3A is a schematic cross-sectional view showing an example of the first recess and/or second recess in the first lead and second lead.
Figure 3D:
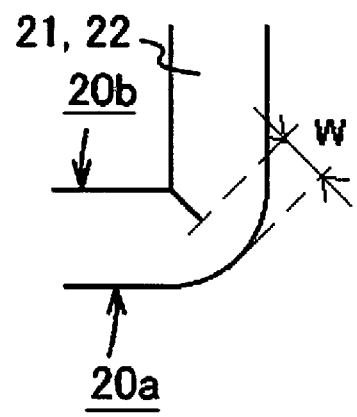
FIG. 3D is a schematic cross-sectional view showing an example of the first recess when the outer lead portion is bent.
Figure 4A:
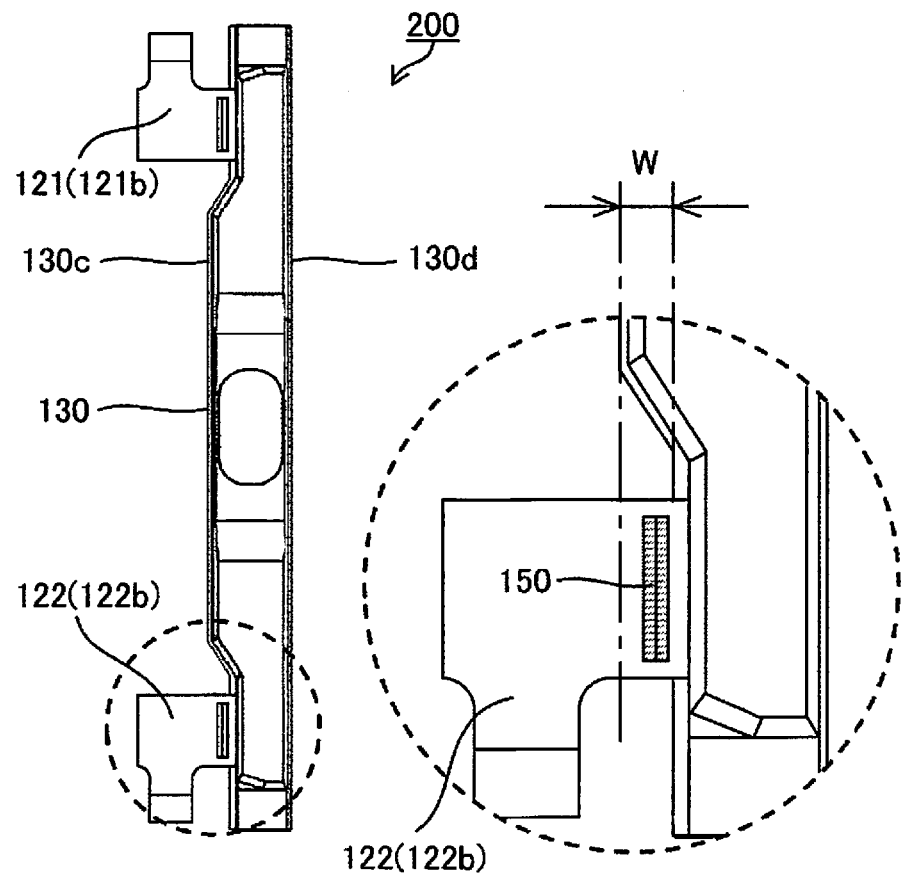
FIG. 4A consists of a schematic rear view illustrating the package in a modification example of the light emitting device in FIG. 1A, and a partial detail view thereof.
Figure 5A:
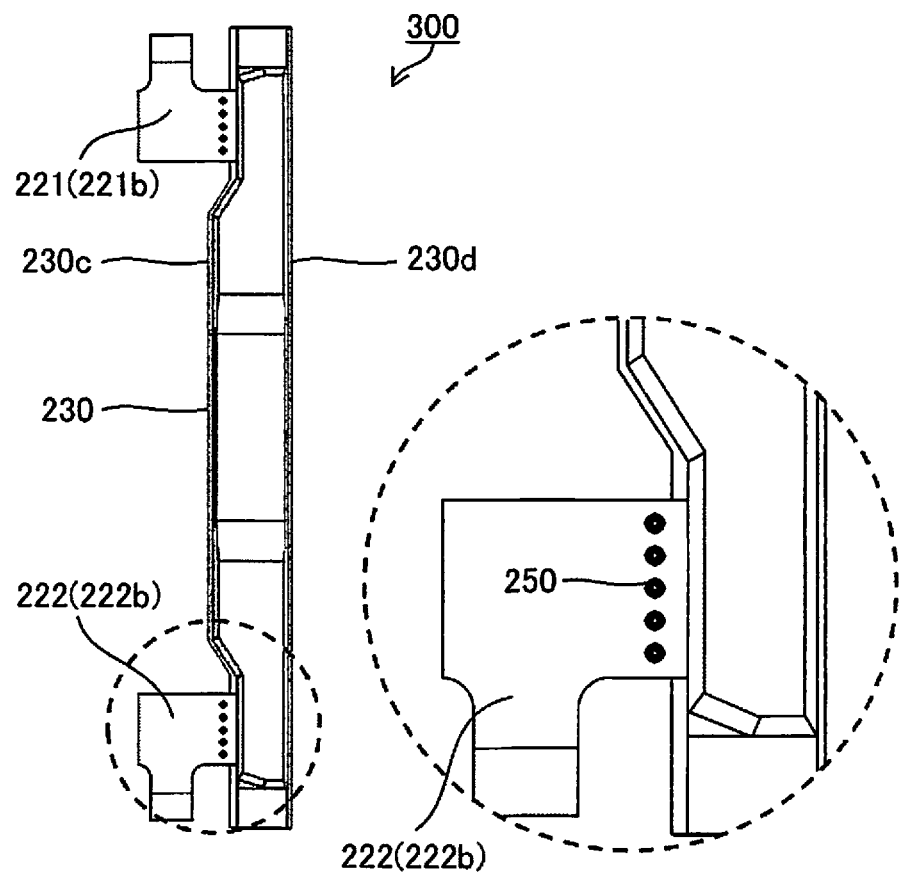
FIG. 5A consists of a schematic rear view illustrating the package in a modification example of the light emitting device in FIG. 1A, and a partial detail view thereof.
Figure 5B:
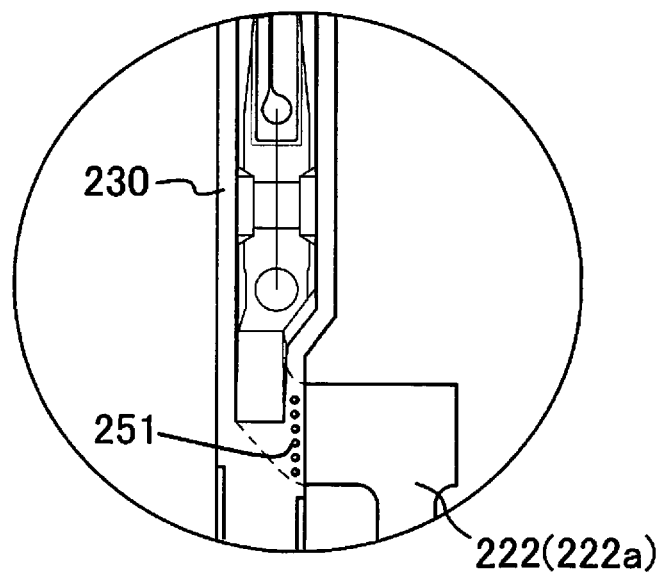
FIG. 5B is a partial detail view of a schematic front view of the package illustrated in FIG. 5A.

As shown in FIG. 2, the first recess 50 is disposed on the second surface 20b side, that is, on the inside of the bent portion, at the bent portion located adjacent to the lower surface 30c of the resin molding 30. The first recess 50 is a thin portion that has a thickness smaller than an average of thickness of the first lead 21 and the second lead 22 before being bent. Each of the thicknesses of the first lead 21 and the second lead 22 is the distance between the first surface 20a and the second surface 20b, specifically, the thin portion is a portion having the smallest thickness the first lead 21 and the second lead 22. The average thickness of the first lead 21 and the second lead 22 is an average of values measured at thirty or more locations that are positioned with substantially certain intervals therebetween in the first lead 21 and the second lead 22. Before the outer lead is bent, the thickness of the thin portion (i.e., the first recess) is a thickness W that is the shortest one of distances between the first surface 20a and the second surface 20b, as shown in FIG. 3A. After the outer lead is bent, the thickness of the thin portion is the thickness W that is the shortest one of distances between the first surface 20a and the second surface 20b, the as shown in FIGS. 1E and 3D. As shown in FIG. 2, for example, the first recess 50 may be in the form of a single groove that is disposed from one end of the outer lead portions 21b and 22b to the other end, along the lower surface 30c of the resin molding 30, that is, over the entire width of the outer lead portions 21b and 22b. This makes it easier to bend the outer lead portions 21b and 22b. It may also be in the form of a plurality of consecutive grooves like a broken line. Also, as shown in FIG. 4A, it may be a single groove 150 disposed along the lower surface 130c of a resin molding 130, from the inside at one end of outer lead portions 121b and 122b to the inside at the other end, that is, not over the entire width of the outer lead portions 121b and 122b. Further, as shown in FIG. 5, a plurality of holes 250 may be disposed in a single row along the lower surface 230c of a resin molding 230, from one end of outer lead portions 221b and 222b to the other end. Also, a plurality of the first recesses 50 discussed above may be provided. For example, two or more grooves may be provided over substantially the entire width of the inner lead portions 21a and 22a.

The first recess 50 is provided on the inside of the bent portions of the outer lead portions 21b and 22b. Accordingly, in this embodiment in which the outer lead portions 21b and 22b are bent toward the rear surface 30b of the resin molding 30, the first recesses 50 are disposed on the second surface 20b side of the outer lead portions 21b and 22b. However, if the outer lead portions 21b and 22b are bent toward the front surface 30a side of the resin molding 30, then the first recess portions 50 are provided at the first surface 20a of the outer lead portions 21b and 22b.

Figure 4B:
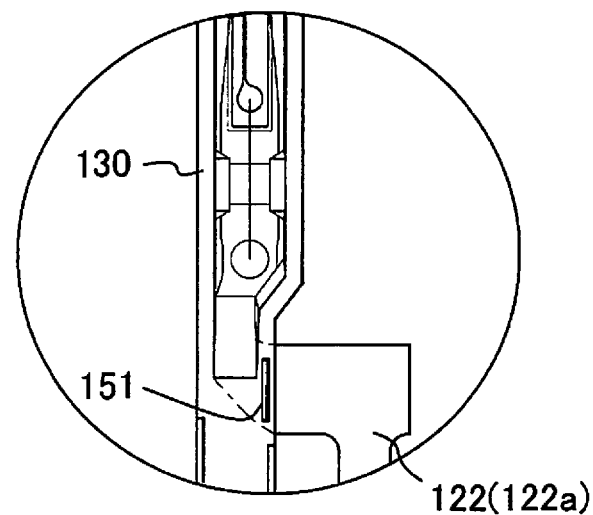
FIG. 4B is a partial detail view of a schematic front view of the package illustrated in FIG. 4A.

The inner lead portions 21a and 22a are continuously disposed in such a manner as to respectively correspond to the outer lead portions 21b and 22b, and include an embedded portion that is embedded in the resin molding 30, and an exposed portion that is partially exposed at the bottom surface inside the opening 32 of the resin molding 30. As shown in FIG. 2, the embedded portions of the inner lead portions 21a and 22a in this embodiment each include a second recess 51 provided on the opposite side from the side where the first recess 50 is provided, that is, on the first surface 20a side. The second recess 51 is the thin portion that has the thickness smaller than the average thickness of the first lead 21 and the second lead 22. The second recesses 51 in this embodiment are provided at a position closer to the outer lead than the exposed portion, and extending along the lower surface 30c. For example, the second recess 51 may be a single groove shape provided along the lower surface 30c of the resin molding 30, over substantially the entire width of the inner lead portions 21a and 22a. This improves adhesion between the inner lead portions 21a and 22a and the resin molding 30. It may also be in the form of a plurality of consecutive grooves like a broken line. Also, as shown in FIGS. 4A and 4B, it may be a single groove 151 disposed along the lower surface 130c of the resin molding 130, from the inside at one end of the outer lead portions 121b and 122b to the inside at the other end, that is, not over substantially the entire width of the outer lead portions 121b and 122b. Also, as shown in FIG. 5, a plurality of holes 251 may be disposed in a single row along the lower surface 230c of the resin molding 230, from one end of the outer lead portions 221b and 222b to the other end. Also, a plurality of the second recesses 51 discussed above may be provided. For example, two or more grooves may be provided over substantially the entire width of the inner lead portions 221a and 222a. Part of the resin molding 30 is disposed in the second recess 51.

The second recess 51 is provided on the opposite side of the outer lead portions 21b and 22b from the side where the first recess 50 is provided. Accordingly, in this embodiment in which the first recesses 50 are disposed on the second surface 20b side of the outer lead portions 21b and 22b, the second recesses 51 are disposed on the first surface 20a of the inner lead portions 21a and 22a. However, if the outer lead portions 21b and 22b are bent to the front surface 30a side of the resin molding 30, and the first recesses 50 are provided on the first surface 20a side of the outer lead portions 21b and 22b, the second recesses 51 are provided at the second surface 20b of the inner lead portions 21a and 22a.

In FIGS. 2, 4, and 5, the first recesses 50 and the second recesses 51 are depicted as both having the same shape, but the first recesses 50 and the second recesses 51 may have mutually different shapes (from among those discussed above), and different shapes may be combined between the first lead and the second lead.

The thicknesses of the first lead 21 and the second lead 22 can be appropriately adjusted depending on the characteristics, size, and so forth of the light emitting device to be obtained. Examples of the thicknesses are in a range of 0.05 mm to 1 mm, preferably in a range of 0.07 mm to 0.3 mm, and more preferably in a range of 0.1 mm to 0.2 mm.

The depths of the first recesses 50 and the second recesses 51 can be appropriately adjusted according to the thickness of the leads. Examples of the depths are in a range of ⅕ to ½ the thickness of the outer lead portion, and preferably in a range of ¼ to ½.

The widths of the first recesses 50 and the second recesses 51 are about 40 μm to 100 μm, for example.

The length of the first recesses 50 and the second recesses 51 (i.e., the length in the direction in which the recesses extend, such as a direction parallel to the lower surface 30c of the resin molding 30) is, for example, from one-half or equal to the width of the outer lead portions. As shown in FIG. 4A, when the first recesses 150 are formed from near one end of the outer lead portions 121b and 122b to near the other end, and the recesses are not formed at both ends of the first recesses 150, the first recesses 150 are preferably provided in a length that is about 30 μm to 60 μm, and preferably about 50 μm, away from the ends of the outer lead portions 121b and 122b. This configuration maintains good strength at the bent portions of the leads.

The distance between the first recess 50 and the second recess 51 in plan view can be appropriately adjusted depending on the characteristics and size of the light emitting device to be obtained, the thickness of the resin molding, the thickness of the lead frame, and so forth. Examples of the distance thereof is in a range about 1 μm to 100 μm, preferably in a range about 50 μm to 100 μm, and more preferably about 80 μm.

Within these ranges, adequate strength of the first lead 21 and the second lead 22 can be ensured.

The first recesses 50 and the second recesses 51 can reduce variance in the bending position and the bending angle of the leads when the outer lead portions are bent, as will be discussed below. A light emitting device having good mounting accuracy can be obtained by using the first surface 20a of the bent outer lead portions 21b and 22b as the mounting surface of the light emitting device. In particular, if the second recess 51 is disposed in the embedded portion of the inner lead portion of the resin molding will be embedded in the second recess. This relieves stress during bending. In other words, even if stress is caused by the bending of the lead, the second recess 51 at the outer surface of the bent portion can provide an anchoring effect at part of the resin molding embedded in the second recess 51, thereby enabling good adhesion between the lead and the resin molding, and reduction in the likelihood of separation between the resin molding and the lead. As a result, moisture that deteriorates the members of the light emitting device 100 will be less likely to come in through the gap between the resin and the lead, and solder flux and the like used in the mounting of the light emitting device 100 to a mounting board will be less likely to intrude the interior of the light emitting device 100. Therefore, a light emitting device 100 with high reliability can be obtained.

As shown in FIG. 3, the first recess 50 or the second recess 51 may have a cross section that is U shaped, V shaped, or in the form of a squared-off U. The first recess 50 and the second recess 51 are preferably formed so that the width on the second surface 20b side or the width on the first surface 20a side is greater than the width on the bottom side. Such a recess, and particularly the first recess 50, is effective at suppressing spring-back of the lead at the bent portion, as shown in FIG. 3D.

As shown in FIG. 3A, for example, the shape of this recess is preferably V shaped in cross section. In this case, the opening angle of the V shape is 60° to 120°, and more preferably 80° to 100°, and the bottom of the V-shaped groove may be rounded.

Figure 3B:
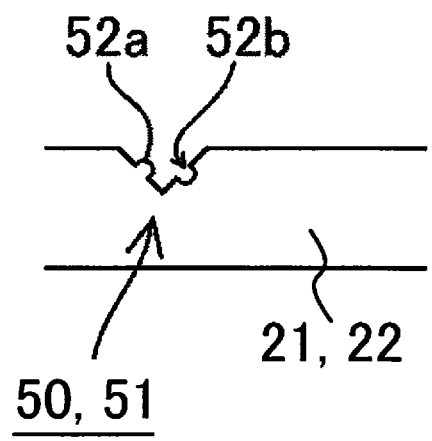
FIG. 3B is a schematic cross-sectional view showing an example of the first recess and/or second recess in the first lead and second lead.

Also, as shown in FIG. 3B, the first recess 50 and the second recess 51 may have a protrusion 52a on one interior side surface and a depression 52b on the other side surface. In particular, it is preferable for the first recess 50 to have a shape such that the protrusion 52a and the depression 52b mate with each other, as shown in FIG. 3E when the outer lead portions 21b and 22b are bent. This stabilizes the bending angle of the leads.

Figure 3C:
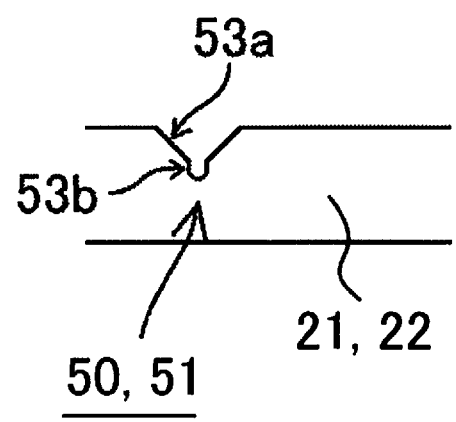
FIG. 3C is a schematic cross-sectional view showing an example of the first recess and/or second recess in the first lead and second lead.
Figure 3E:
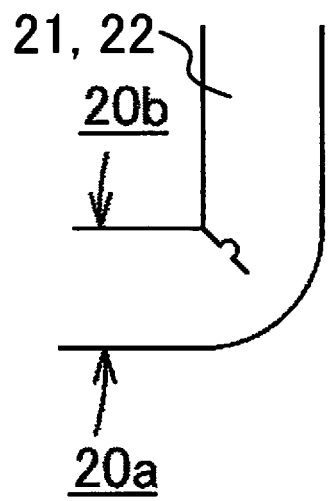
FIG. 3E consists of a schematic cross-sectional view showing an example of the first recess when the outer lead portion is bent.
Figure 3F:
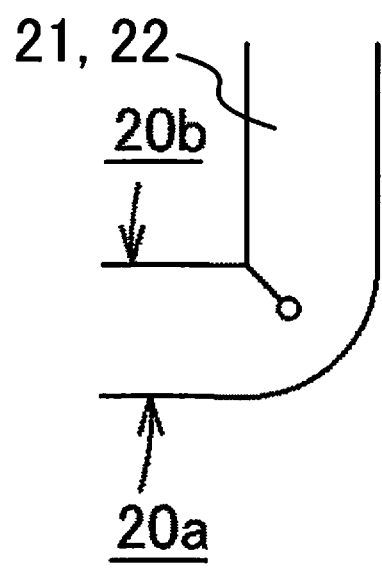
FIG. 3F consists of a schematic cross-sectional view showing an example of the first recess when the outer lead portion is bent.

As shown in FIG. 3C, the first recesses 50 and the second recess 51 preferably have a shape with a vertical surface or that has a larger inclination angle than V-shaped inclined surfaces at the bottom of a V-shaped groove in cross section. In particular, forming the first recesses 50 in such a shape allows a space to be provided inside the bent portion after bending the leads, as shown in FIG. 3F, the stress exerted on the bent portion can be relieved, and the bending angle of the leads can be stabilized.

Resin Molding 30

The resin molding 30 in this embodiment includes an opening 32 in its front surface 30a. Also, the resin molding 30 includes part of the first lead 21 and the second lead 22a embedded therein, and includes a lower surface 30c that is adjacent to the front surface 30a.

The lower surface 30c of the resin molding 30 includes lead disposition portions 34a where the outer lead portions 21b and 22b are disposed, and a protrusion portion 34b positioned below the lead disposition portions 34a.

Examples of the shortest distance (i.e., thickness) between the lower surface 30c and the upper surface 30d of the resin molding 30 include in a range of 0.1 mm to 1 mm, preferably in a range of 0.1 mm to 0.5 mm and more preferably in a range of 0.2 mm to 0.3 mm. When the thickness of the resin molding 30 is in a range of about 0.2 mm to 0.3 mm, the thickness of the walls of the resin molding 30, such as the thickness of the wall between the opening 32 and the lower surface 30c, is thinner. Therefore, the resin molding 30 tends to be damaged in the bending of the outer lead portions 21b and 22b. However, in this embodiment, stress in the bending of the outer lead portions 21b and 22b can be relieved better, so there is less likelihood of breakage, etc., of the resin molding 30.

The resin molding 30 constitutes a part of the outer shape of the package 10. From the standpoint of light extraction efficiency toward the front, the resin molding 30 preferably has a reflectivity at the emission peak wavelength of the light emitting element 40 of 70% or more, more preferably 80% or more, and even more preferably 90% or more. The resin molding 30 is preferably white. The resin molding 30 can be formed by injection molding, transfer molding, or another such method.

The resin molding 30 can be formed using a thermosetting resin or a thermoplastic resin. A thermoplastic resin is preferable because it can be easily molded by injection molding, and it is inexpensive than a thermosetting resin. Any one of an aliphatic polyamide resin, polycyclohexane terephthalate, or polycyclohexylene dimethylene terephthalate is preferable as the thermoplastic resin. Also, a thermosetting resin is preferable from the standpoints of having better heat resistance and light resistance, a longer service life, and higher reliability than a thermoplastic resin. Any one of an epoxy resin, a silicone resin, or an unsaturated polyester resin is preferable as the thermosetting resin. In particular, an unsaturated polyester resin or a modified resin thereof is preferable because it can be molded by injection molding while having the good heat resistance and light resistance of a thermosetting resin. From the standpoints of reflectivity, mechanical strength, thermal expansion/contraction, and so forth, the resin forming the resin molded article 30 preferably contains one or more types of white pigment and/or filler such as titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, or zirconium oxide. Among these, titanium oxide is preferable because it has a relatively high refractive index and good light blocking property.

When a thermosetting resin, in particular, an unsaturated polyester, is used as the material of the resin molding 30, the resin molding 30 will be more brittle and may be easily broken. The resin molding 30 is prone to damage in the bending of the outer lead portions 21b and 22b. However, in this embodiment, since stress is relieved well in the bending of the outer lead portions 21b and 22b, there is less likelihood of breakage, etc., of the resin molding 30.

Light Emitting Element

The light emitting element 40 in this embodiment is placed on the first surface 20a of the inner lead portion 21a of the first lead 21 via an adhesive material. The pair of positive and negative electrodes of the light emitting element 40 are respectively electrically connected to the first surface 20a of the two inner lead portions 21a and 22a via wires. Alternatively, the light emitting element may be flip-chip mounted on the first lead 21 and the second lead 22.

A semiconductor light emitting element such as a light emitting diode can be used as the light emitting element, for example. The light emitting element can include a light-transmissive substrate and a semiconductor stacked-layer formed thereon. The light-transmissive substrate can be, for example, a light-transmissive insulating material such as sapphire ($Al_2O_3$), a semiconductor material that transmits light emitted from the semiconductor stacked-layer (e.g., a nitride-based semiconductor material), or the like. The semiconductor stacked layer includes, for example, a plurality of semiconductor layers such as an n-type semiconductor layer, a light emitting layer (i.e., active layer), and a p-type semiconductor layer. Examples of the semiconductor layer include semiconductors of group III-V compounds, and semiconductors of group II-VI compounds. More specifically, a nitride-based semiconductor material such as $In_XAl_YGa_{1-X-Y}N$ ($0 \leq X$, $0 \leq Y$, $X+Y \leq 1$) can be used. The light emitting element may have a configuration in which the electrodes are provided on the same surface side, or a configuration in which the electrodes are provided on different surface sides. The electrodes are preferably made of a good electrical conductor, examples of which include copper and other such metals.

Embodiment 2

Method for Manufacturing Light Emitting Device

The method for manufacturing a light emitting device in this embodiment contains a step of providing the above-mentioned package and bending the outer lead portion along the lower surface of the resin molding in the first recess.

(1) Provision of Package 10

Figure 6A:
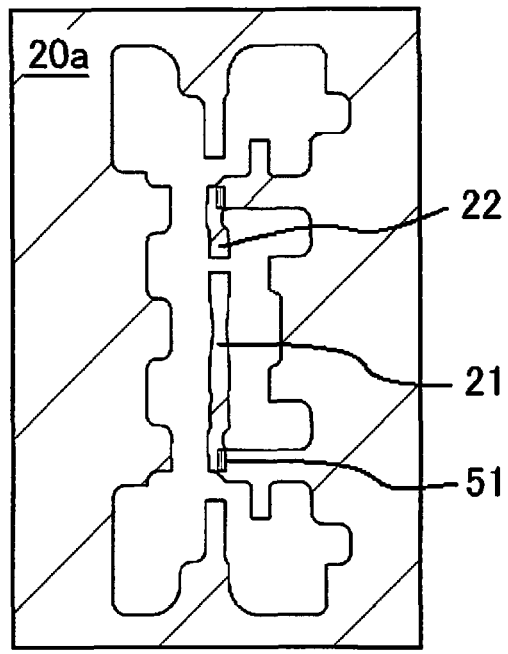
FIG. 6A is a schematic plan view of a lead, illustrating the first lead and the second lead of the light emitting device in FIG. 1A.
Figure 6B:
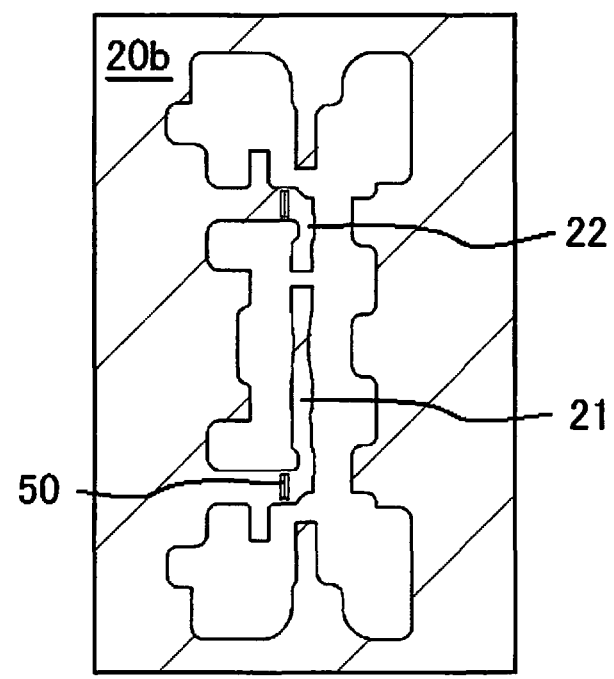
FIG. 6B is a schematic rear view of the lead in FIG. 6A.

First, a metal plate to serve as a lead frame is provided. As shown in FIGS. 6A and 6B, the portions for serving as the first lead 21 and the second lead 22 are subjected to various types of machining such as scooping out, pressing (including punching), etching, and rolling to form this metal plate as a lead frame including the first lead 21 and the second lead 22. Examples of the metal plate include a single-layer flat plate of copper, aluminum, gold, silver, tungsten, iron, nickel, cobalt, molybdenum, or an alloy thereof, and multilayer of these metals or alloys. A copper alloy containing copper as the main component (e.g., phosphor bronze, iron-containing copper, etc.) are particularly favorable. Also, a light reflecting film such as silver, aluminum, rhodium, or an alloy of these may be provided on the surface of this plate, and it is especially desirable to cover it with a light reflecting film of silver or a silver alloy, which reflects light very well. In FIGS. 6A and 6B, a lead frame including parts for serving as the first lead 21 and the second lead 22 is depicted as a single unit, but usually machining is performed such that a plurality of these units are arranged in a matrix.

Figure 2A:
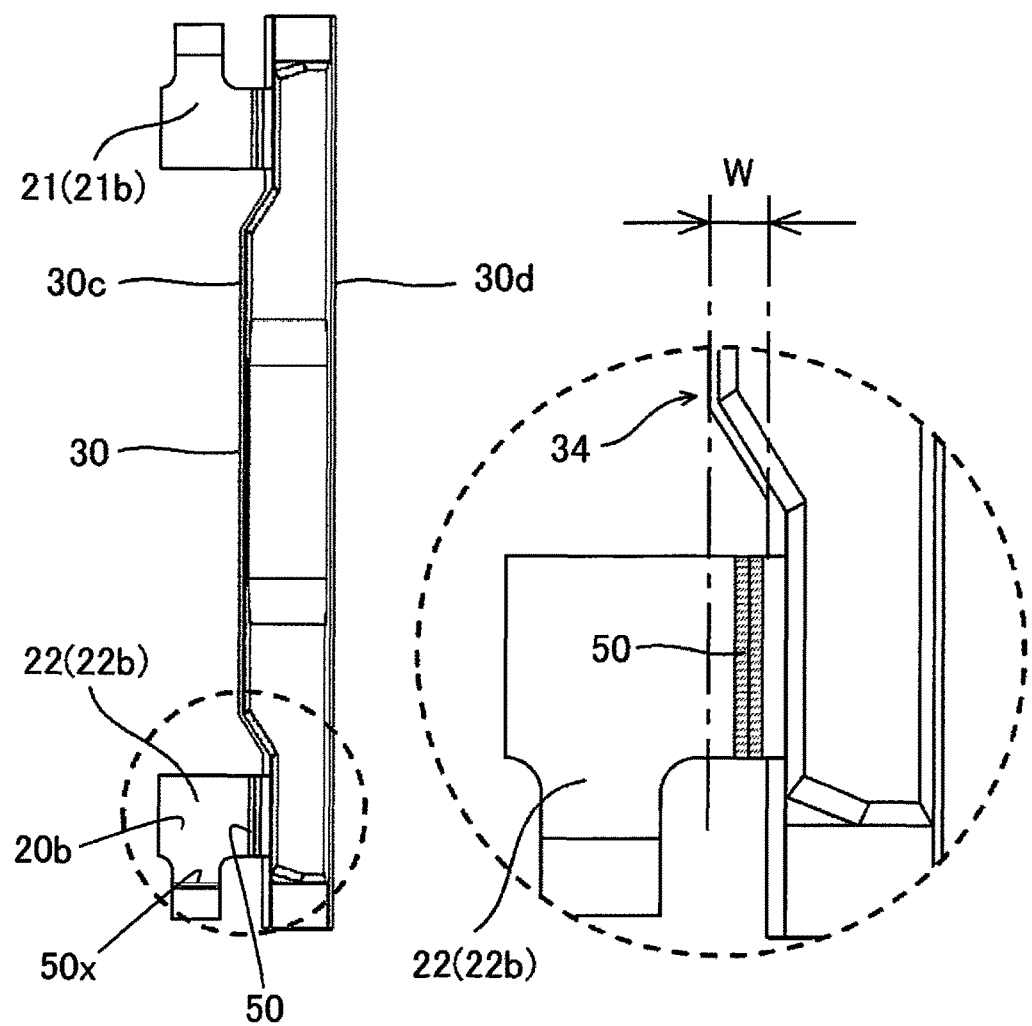
FIG. 2A consists of a schematic rear view illustrating a package used in the light emitting device in FIG. 1A, and a partial detail view thereof.

As shown in FIG. 2A, the first surfaces 20a of the first lead 21 and the second lead 22 include the second recesses 51 formed in an area corresponding to the embedded portion of the inner lead portion. That is, the second recesses 51 are formed at a position closer to the area corresponding to the outer lead than the area corresponding to the exposed portion of the inner lead portion, and extending in along the lower surface 30c of the resin molding 30 discussed below.

Figure 2B:
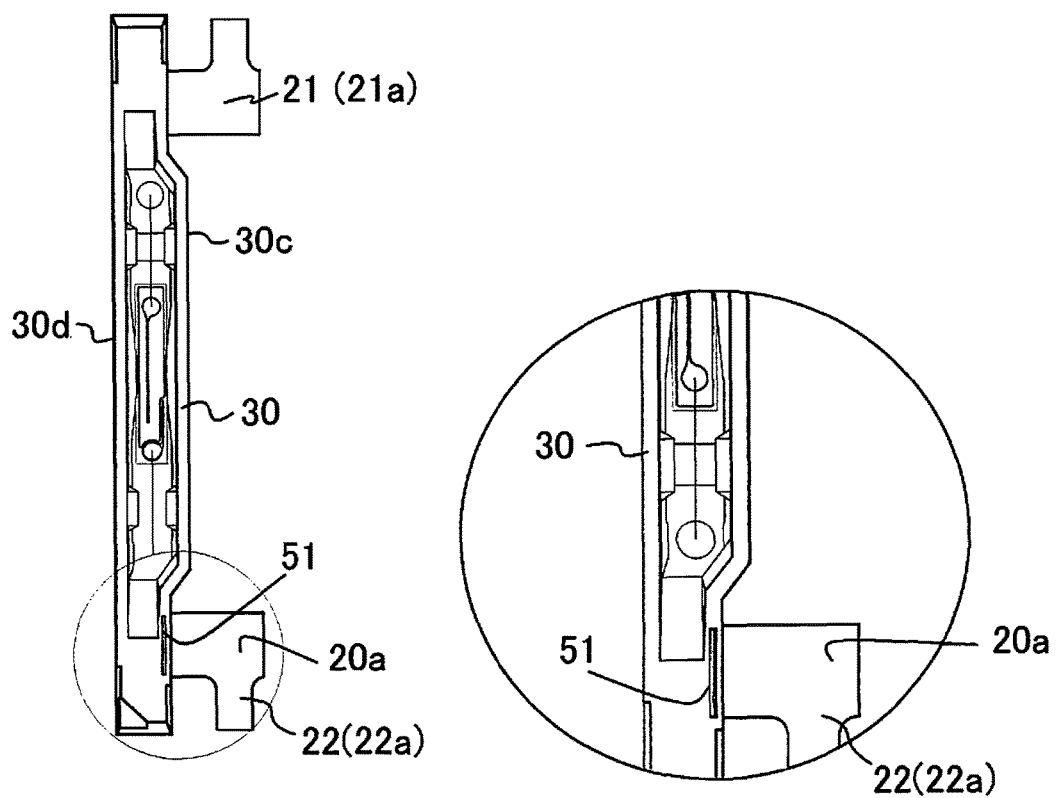
FIG. 2B consists of a schematic front view of the package illustrated in FIG. 2A, and a detail view thereof.

As shown in FIG. 2B, the second surfaces 20b of the first lead 21 and the second lead 22 include the first recesses 50 formed in areas corresponding to the outer lead portions 21b and 22b. The first recesses 50 are adjacent to the lower surface 30c of the resin molding 30 discussed below, and extend along the lower surface 30c. The first recesses 50 may be formed after forming the resin molding discussed below.

The first recesses 50 and the second recesses 51 can be formed, for example, by pressing, cutting, etching, laser light irradiation, or the like. With a method involving laser light irradiation, the first recesses 50 can be accurately formed even after forming the resin molding 30.

Figure 7A:
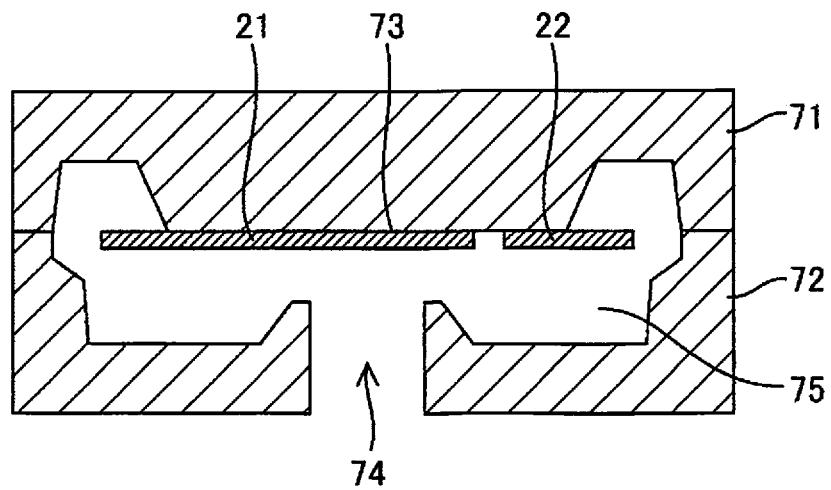
FIG. 7A is a schematic cross-sectional view of a process of manufacturing the light emitting device in an embodiment.

After this, as shown in FIG. 7A, this lead frame is disposed between an upper mold 71 and a lower mold 72. In the upper mold 71, the portion of the upper surface 73 corresponding to the opening of the package is in contact with the first surface 20a of the inner lead portions 21a and 22a. At this point, part of the inner lead portion 21a of the first lead 21 including the second recess 51 and the portion of the second lead 22 to be the embedded portion of the inner lead portion 22a are disposed in a space 75 sandwiched between the upper mold 71 and the lower mold 72, and the outer lead portion 21b of the first lead 21 and the outer lead portion 22b of the second lead 22 are not disposed in the space 75.

Figure 7B:
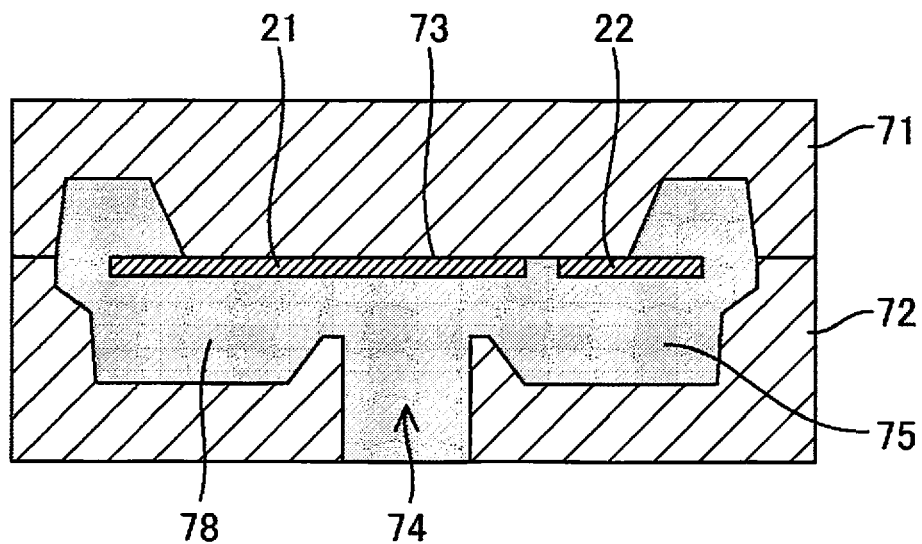
FIG. 7B is a schematic cross-sectional view of a process of manufacturing the light emitting device in the embodiment.
Figure 7C:
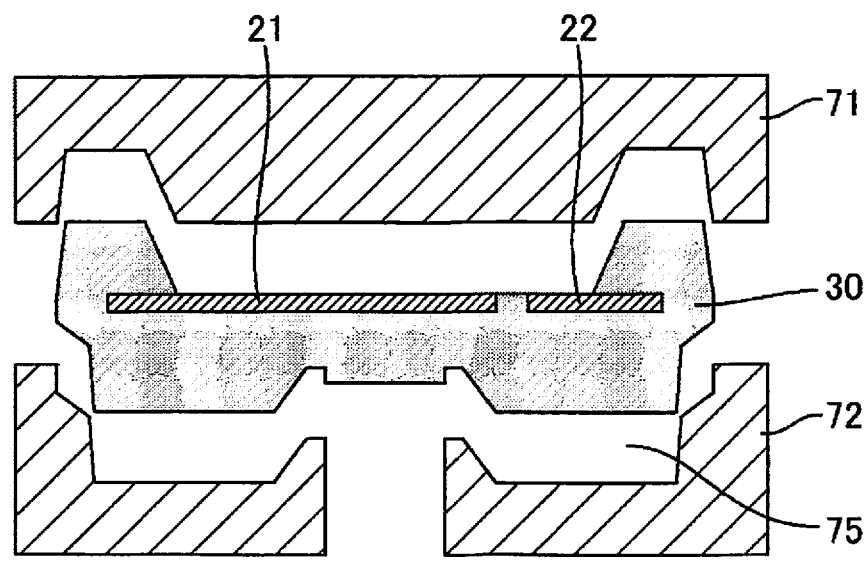
FIG. 7C is a schematic cross-sectional view of a process of manufacturing the light emitting device in the embodiment.
Figure 8A:
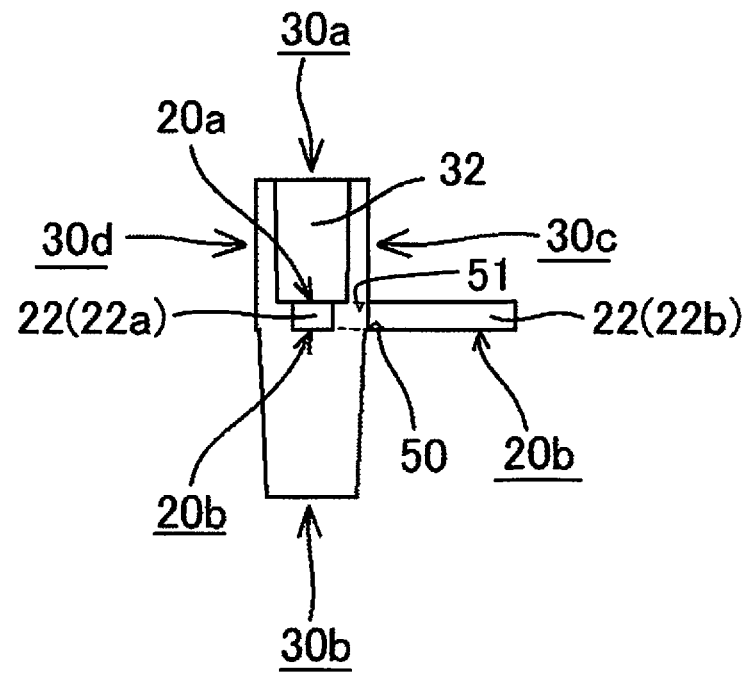
FIG. 8A is a schematic cross-sectional view of a process of manufacturing the light emitting device in the embodiment.
Figure 8B:
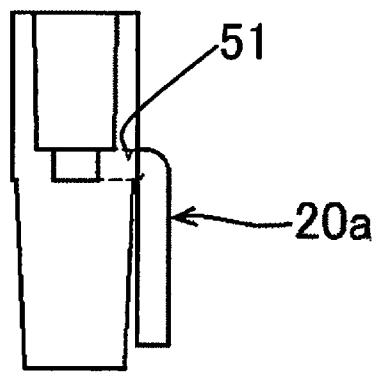
FIG. 8B is a schematic cross-sectional view of a process of manufacturing the light emitting device in the embodiment.

As shown in FIG. 7B, resin material 78 is injected into the space 75 sandwiched between the upper mold 71 and the lower mold 72 from a gate 74 provided to the lower mold 72. Consequently, part of the inner lead portion 21a of the first lead 21 and part of the inner lead portion 22a of the second lead 22 can be exposed on the bottom surface of the opening of the package 10 that is obtained. The resin material 78 supplied in the mold is cured or solidified to form the resin molding 30. Thereafter, as shown in FIG. 7C, the upper mold 71 and the lower mold 72 are removed.

The leads are then cut and their shape is adjusted to match the resin molding 30.

As shown in FIG. 2, for example, the package 10 thus obtained is such that the outer lead portion 21b of the first lead 21 and the outer lead portion 22b of the second lead 22 extend perpendicularly from the lower surface 30c of the resin molding 30. In this case, the first recesses 50 are exposed from the resin molding 30, but the second recesses 51 are embedded in the resin molding 30, and thus the resin constituting the resin molding 30 is embedded in the second recesses.

Providing the first recesses 50 and the second recesses 51 makes it possible to stabilize the bending position and the bending angle of the leads when bending the outer lead portions 21b and 22b (discussed below). In particular, embedding the second recess 51 by a portion of the resin molding close to the outer lead portion allows the embedded portion of the inner lead to be maintained in the appropriate position even if subjected to stress caused by bending of the leads. Therefore, separation of the resin can be prevented or discouraged, and stress can be further relieved to well stabilize the folding of the leads.

(2) Step of Bending Outer Lead Portions

The outer lead portions 21b and 22b are respectively bent at the first recesses 50 such that the outer lead portions 21b of the first lead 21 and the outer lead portion 22b of the second lead 22 are each opposite the lower surface 30c of the resin molding 30. Consequently, the first surface 20a of the outer lead portions 21*b* and 22*b* serves as the mounting surface of the light emitting device 100.

The outer lead portions 21*b* and 22*b* each include a branching component (see 21*x* and 22*x* in FIG. 1B) at their distal end, and at least a part of these branching components can be bent toward the front surface 30*a* side along the left and right side surfaces of the resin molding 30. Recesses may also be formed on the second surface 20*b* side of the bent components of the branching components 21*x* and 22*x* (see 50*x* in FIG. 2), and the branching components 21*x* and 22*x* may be bent at these recesses. These branching components are preferably bent in advance at a specific angle before bending the portions of the outer lead portions 21*b* and 22*b* for serving as mounting surfaces.

With the light emitting device 100 formed in this way, variance in the lead bending position and bending angle can be reduced by bending the outer lead portion 21*b* and 22*b* in the vicinity of the second recesses 51 and in the first recesses 50 along the lower surface 30*c* of the resin molding 30. A light emitting device with good mounting accuracy can be obtained by using the first surfaces 20*a* of the outer lead portions 21*b* and 22*b* bent as the mounting surfaces of the light emitting device. Also, spring-back in the bent portions can be mitigated in the light emitting device 100. Furthermore, part of the resin molding is embedded in the second recesses 51, thereby further enabling release of stress during bending and reduction of variance in the bending position and bending angle of the leads. Also, even if stress is applied due to bending of the leads, the embedded portion of the inner leads can be maintained in the appropriate position, and separation of the resin can be prevented or discouraged. As a result, fixing can be stably performed during mounting of the light emitting device 100 to a mounting substrate or the like, and variance in the attachment angle after mounting can be mitigated.

After the package 10 is obtained, and either before or after outer leads is bent, the light emitting element 40 is bonded to the package 10, such as to the first surface 20*a* of the first lead 21, using an adhesive member. Thereafter, the light emitting element 40 is electrically connected to the first lead 21 and the second lead 22 by wires. Preferably the light-transmissive resin 60 is supplied into the opening 32 of the resin molding 30 to encapsulate the light emitting element 40.

The light emitting device of the present disclosure can be used for a variety of light sources, for example, backlight for liquid crystal displays, various kinds of lighting, large display, various kinds of display device applied for, for example, advertising and destination guide, projector, image reading device in digital video camera, facsimile, copying machine, scanner, and the like.

As illustrated above, embodiments are described to give a concrete form to technical ideas of a light emitting device and a method for manufacturing thereof according to the present disclosure is not limited to the described embodiments of the present invention. Also, obviously, numerous modifications and variations of the present invention are possible in light of the above teachings, which are within the scope and spirit of the invention, and such other modifications and variations are intended to be covered by the following claims.

What is claimed is:

1. A light emitting device comprising:
   a resin molding including a front surface defining an opening, and a lower surface adjacent to the front surface;
   a first lead and a second lead each including
   an outer lead portion protruding from the lower surface of the resin molding, and including a bent portion bent along the lower surface of the resin molding, a surface on an inner side of the bent portion including a first recessed section,
   an inner lead portion including an embedded portion embedded in the resin molding, and an exposed portion exposed in the opening, a surface of the embedded portion opposite from the surface where the first recessed section is provided including a second recessed section with a part of the resin molding being positioned in the second recessed section; and
   a light emitting element placed in the opening of the resin molding,
   wherein the second recessed section extends in a direction along the lower surface of the resin molding, at a location closer to the outer lead portion than the exposed portion.

2. The light emitting device according to claim 1, wherein at least one of the first recessed section and the second recessed section includes a groove.

3. The light emitting device according to claim 1, wherein a depth of at least one of the first recessed section and the second recessed section is at least one-fifth and no more than one-half of a thickness of the outer lead portion.

4. The light emitting device according to claim 1, wherein the outer lead portion is bent at the bent portion toward a rear surface of the resin molding opposite from the front surface.

5. The light emitting device according to claim 1, wherein the outer lead portion is bent at the bent portion toward the front surface of the resin molding.

6. The light emitting device according to claim 1, wherein at least one of the first recessed section and the second recessed section has a V-shape in cross section.

7. The light emitting device according to claim 1, wherein a shortest distance between the lower surface of the resin molding and an upper surface, opposite from the lower surface is 0.2 mm to 0.3 mm.

8. The light emitting device according to claim 1, wherein the material of the resin molding includes a thermosetting resin.

9. A method for manufacturing a light emitting device comprising:
   providing a package including
   a resin molding including a front surface defining an opening, and a lower surface adjacent to the front surface,
   a first lead and a second lead each including
   an outer lead portion protruding from the lower surface of the resin molding, a surface of the outer lead portion including a first recessed section,
   an inner lead portion including an embedded portion embedded in the resin molding, and an exposed portion exposed in the opening, a surface of the embedded portion opposite from the surface where the first recessed section provided including a second recessed section with a part of the resin molding being positioned in the second recessed section; and
   bending each of the first lead and the second lead at the first recessed section of the outer lead portion such that the outer lead portion extends along the lower surface of the resin molding, and
   providing each of the first lead and the second lead such that the second recessed section of the inner lead portion extends in a direction along the lower surface of the resin molding, at a location closer to the outer lead portion than the exposed portion.

10. A light emitting device, comprising:
a first lead and a second lead;
a resin molding including an opening in a front surface thereof, embedding a portion of the first lead and the second lead, and including a lower surface adjacent to the front surface; and
a light emitting element placed in the opening,
wherein the first lead and the second lead each includes
an outer lead portion protruding from the lower surface of the resin molding, and including a bent portion that is bent along the lower surface of the resin molding, and
an inner lead portion including an embedded portion that is embedded in the resin molding, and an exposed portion that is exposed in the opening,
wherein at least one of the first lead and the second lead includes a thin portion or a plurality of holes provided on the bent portion of the outer lead portion and the embedded portion of the inner lead portion, and the thin portion has a thickness smaller than an average thickness of the first lead and the second lead, and
wherein at least one of the thin portion or the plurality of holes extends in a direction along the lower surface of the resin molding, at a location closer to the outer lead portion than the exposed portion.

11. The light emitting device according to claim 1, wherein
the first recessed section has a space inside the bent portion.

* * * * *